United States Patent
Arase (10) Patent No.: US 8,163,329 B2
(45) Date of Patent: Apr. 24, 2012

(54) METHOD FOR MOUNTING A COMPONENT

(75) Inventor: Hidekazu Arase, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/098,034

(22) Filed: Apr. 29, 2011

(65) Prior Publication Data

US 2011/0203731 A1 Aug. 25, 2011

Related U.S. Application Data

(63) Continuation of application No. PCT/JP2010/005304, filed on Aug. 27, 2010.

(30) Foreign Application Priority Data

Oct. 6, 2009 (JP) ................................ 2009-232342

(51) Int. Cl.
*B05D 5/12* (2006.01)
*H05K 3/20* (2006.01)
*H05K 3/30* (2006.01)

(52) U.S. Cl. ................. 427/58; 29/831; 29/832; 29/834

(58) Field of Classification Search ........................ None
See application file for complete search history.

(56) References Cited

U.S. PATENT DOCUMENTS

| 4,711,820 | A | * | 12/1987 | Arkles et al. | ................... | 428/429 |
| 7,501,156 | B2 | | 3/2009 | Nakabayashi et al. | | |
| 7,709,291 | B2 | | 5/2010 | Nakagawa | | |
| 7,730,610 | B2 | | 6/2010 | Nakagawa et al. | | |
| 2009/0265929 | A1 | * | 10/2009 | Nakagawa et al. | ............. | 29/846 |
| 2010/0073452 | A1 | | 3/2010 | Nakagawa | | |

FOREIGN PATENT DOCUMENTS

| JP | 2004-095896 | | 3/2004 |
| JP | 2007-059559 | | 3/2007 |
| JP | 4149507 | | 9/2008 |
| JP | 4388138 | | 12/2009 |
| WO | WO 2007/037381 A1 | | 4/2007 |
| WO | WO 2007037381 A1 | * | 4/2007 |

* cited by examiner

*Primary Examiner* — Michael Cleveland
*Assistant Examiner* — James M Mellott
(74) *Attorney, Agent, or Firm* — McDermott Will & Emery LLP (57) ABSTRACT

A method includes steps of (1a) preparing a hydrophilic first liquid, (1b) preparing a component-dispersing liquid where the component is dispersed in a second liquid, (1c) preparing a substrate having a hydrophilic region and a water-repellant region, (2) disposing the first liquid to the hydrophilic region, (3) bringing the component-dispersing liquid in contact with the first liquid disposed on the hydrophilic region, and (4) removing the first liquid and the second liquid from the substrate to dispose the component on the hydrophilic region. The hydrophilic region includes a component-mounting region and a liquid-capturing region surrounding the component-mounting region. The surface of the liquid-capturing region has a material represented by X—$(CH_2)_n$—Si-(substrate), where X represents $N^+R_3Q^-$ (Q represents Cl, Br, or I), OR, or halogen atom, R represents lower alkyl group with a carbon number of 1-4, and n represents a natural number of 1, 2, or 3.

7 Claims, 8 Drawing Sheets

Example 1

FIG. 6A

Example 2

FIG. 6B

Example 3

FIG. 6C

Example 4

FIG. 6D

Compatative Example 1

FIG. 7A

Compatative Example 2

METHOD FOR MOUNTING A COMPONENT

CROSS-REFERENCE TO RELATED APPLICATIONS

This is a continuation of PCT International Application PCT/JP2010/005304 filed on Aug. 27, 2010, which claims priority of Japanese Patent Application No. 2009-232342, filed on Oct. 6, 2009. The disclosures of these applications including the specifications, the drawings, and the claims are hereby incorporated by reference in their entirety.

BACKGROUND OF THE INVENTION

1. Field of the Invention

The present invention relates to a method for mounting a component.

2. Description of Related Art

Active-type liquid crystal display elements and organic electroluminescence display elements are formed on glass substrates. Each of pixels that are arranged in a matrix on the substrate is controlled by a transistor placed in the vicinity of the pixel. With a current technology, however, crystalline semiconductor thin-film transistors cannot be formed on a glass substrate. Therefore, thin film transistors formed using amorphous silicon or polysilicon thin films are used for the control of pixels. Such thin film transistors have the advantage that they can be fabricated on a large-area substrate at low cost. The thin film transistors, however, have the disadvantage that their lower mobility than crystalline silicon prevents them from operating at high speed. To overcome this disadvantage, a large number of transistors are fabricated on a silicon wafer beforehand and then cut into individual pieces to be mounted on a substrate.

Figure 8A:
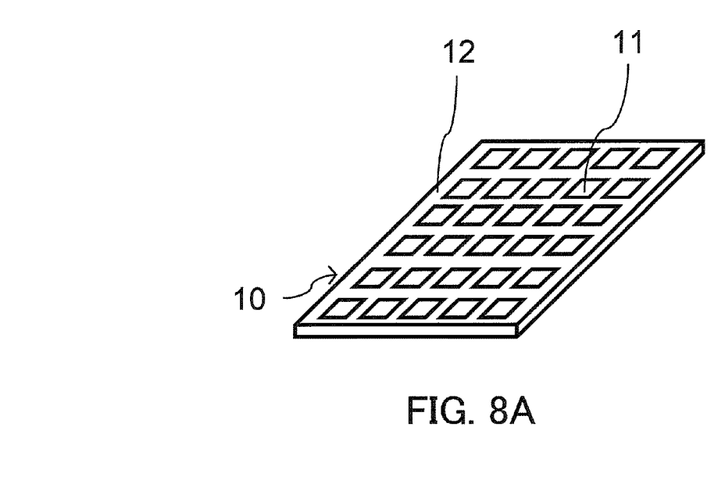
FIGS. 8A to 8D show the steps in the mounting method of the component disclosed in U.S. Pat. No. 7,730,610.
Figure 8B:
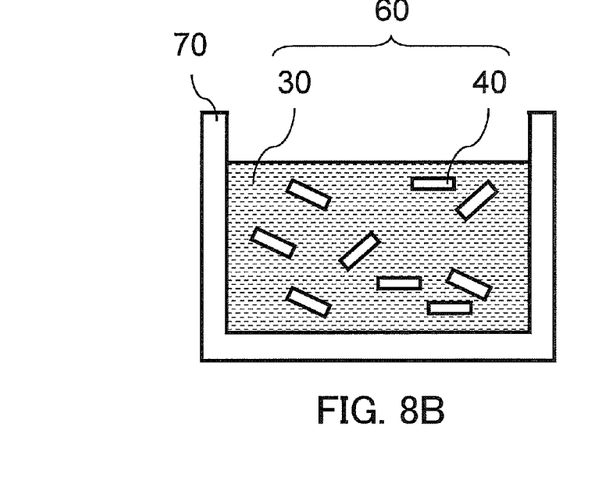

U.S. Pat. No. 7,730,610, which corresponds to Japanese Patent No. 4149507, discloses a method of disposing the components 40 on the substrate 10. As shown in FIG. 8A, in U.S. Pat. No. 7,730,610, a substrate 100 comprising a plurality of hydrophilic regions 11 and a water-repellant region 12 which surrounds the respective hydrophilic regions 11 is prepared. Next, as shown in FIG. 8B, a component-dispersing liquid 60 stored in a vessel 70 is prepared.

Particularly, components 40 to be mounted on the substrate are dispersed in a solvent 300 which is substantially insoluble in water, thereby preparing the component-dispersing liquid 60. One of the surfaces of the component 40 is hydrophilic, and the other surfaces of the component 40 are water-repellent.

Figure 8C:
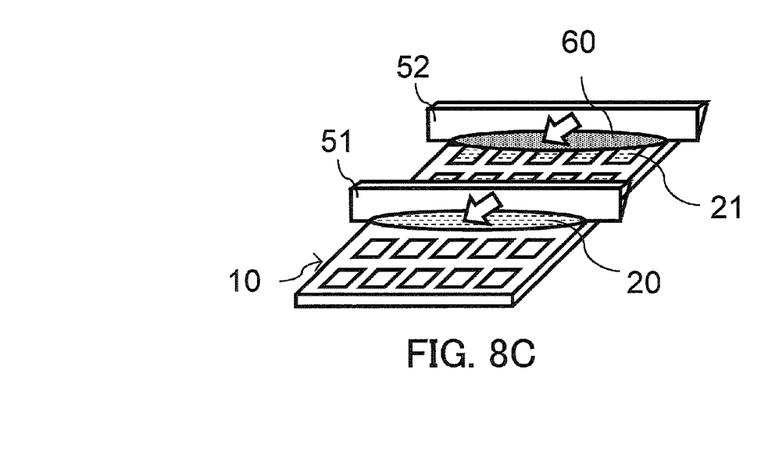

Next, as shown in FIG. 8C, water 20 is disposed in the plurality of hydrophilic regions 11 with a first squeegee 51.

Figure 8D:
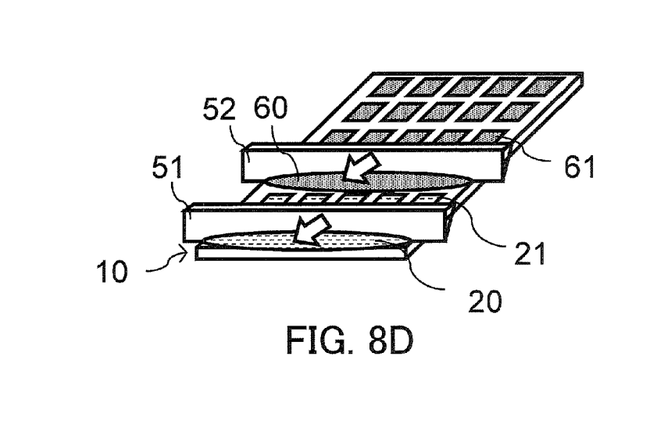

Subsequently, as shown in FIG. 8D, the component-dispersing liquid 60 is applied with a second squeegee 52 to bring the component-dispersing liquid 60 into contact with the water 21 disposed in the hydrophilic regions 11. In FIG. 8D, Referential number 61 indicates the component-containing liquid mounted on the hydrophilic regions 11. During this process, the components 40 move into the water 21 disposed in the hydrophilic regions 11. The hydrophilic surface of the component 40 comes in contact with the water 21. Then, the water 21 and the solvent contained in the component-dispersing liquid 60 are removed so that the components 40 are disposed onto the substrate 10.

SUMMARY OF THE INVENTION

According to the method disclosed in U.S. Pat. No. 7,730,610, the amount of the water 21 disposed on the hydrophilic regions 11 may become smaller, because a slight photo resist can be remained when the hydrophilic regions 11 are formed, or a hydrophobic material present in air is contaminated on the hydrophilic regions 11. This significantly lowers an efficiency of the component 40 to be disposed on the substrate 10, since the component-containing liquid 60 rapidly evaporates before it comes in contact with the water 21. The area of the hydrophilic region 11 may increase in order to increase the amount of the water 21 disposed in the hydrophilic region 11. However, this causes the plurality of the components 40 to be disposed onto one hydrophilic region 11. Furthermore, this causes the component 40 to be disposed in a state where the component 40 is tilted in a planer view ("a distorted state").

The purpose of the present invention is to provide a method for disposing a component accurately with high reproducibility onto a predetermined position, even when a slight photo resist is remained on the hydrophilic region or even when a hydrophobic material in air is contaminated.

The present invention is directed to a method for mounting a component on a substrate, the method comprising steps of:

a step (1a) of preparing a hydrophilic first liquid;

a step (1b) of preparing a component-dispersing liquid where the component is dispersed in a second liquid, wherein the second liquid is insoluble in the first liquid, and the surface of the component is hydrophilic;

a step (1c) of preparing the substrate comprising a hydrophilic region and a water-repellant region, wherein the water-repellant region surrounds the hydrophilic region, the water-repellant region comprises the surface coated with a fluorine compound, the hydrophilic region comprises a component-mounting region having a shape corresponding to that of a part of the substrate where the component is to be mounted and a liquid-capturing region formed on the periphery of the component-mounting region, and the liquid-capturing region is represented by the following chemical formula (I):

(Chemical Formula (I))

in the chemical formula (I), X represents $N^+R_3Q^-$ (Q represents Cl, Br, or I), OR, or halogen atom, R represents lower alkyl group with a carbon number of 1-4, and n represents a natural number of not less than 1 and not more than 3;

a step (2) of disposing the first liquid to the hydrophilic region;

a step (3) of bring the component-dispersing liquid in contact with the first liquid mounted on the hydrophilic region; and a step (4) of removing the first liquid and the second liquid from the substrate to dispose the component on the hydrophilic region.

The term "mount" in the present specification includes "dispose". An example of the components in the present specification is an electric component. The order of the step (1a), the step (1b), and the step (1c) is not limited. These steps (1a)-(1c) are performed before the step (2). The step (2), the step (3), and the step (4) are performed in this order.

The present invention provides a method for mounting a component accurately with high reproducibility on the predetermined position.

DETAILED DESCRIPTION OF THE INVENTION

The embodiment of the present invention is described below in more detail with reference to the drawings. Hatching lines may be omitted in view of clarity. The same reference numerals are assigned to the same elements, and therefore the overlapping description thereof can be omitted.

FIGS. 1A to 1D show examples of hydrophilic regions 110 and a water-repellant region 120. FIGS. 2A to 2E show other examples of the hydrophilic regions 110 and the water-repellant region 120. In the following description, an example of the first liquid is water.

First, prepared is a substrate 100 shown in FIGS. 1A to 1D and in FIGS. 2A to 2E. The substrate 100 comprises a hydrophilic region 110 and a water-repellant region 120. Preferably, a plurality of the hydrophilic regions 110 are prepared. The water-repellant region 120 surrounds each of the plurality of the hydrophilic regions 110.

In each of the hydrophilic regions, a component-mounting region 111, a water-capturing region 112 are formed in such a manner that the wettability of the component-mounting region 111 and the liquid-capturing region 112 to water is higher than that of the water-repellant region 120. Particularly, the component-mounting region 111 and the liquid-capturing region 112 are hydrophilic. The water-repellant region 120 is water-repellant.

The liquid-capturing region 112 is represented by the chemical formula (I).

(Chemical Formula (I))

In the chemical formula (I), X represents $N^+R_3Q^-$ (Q represents Cl, Br, or I), OR, or a halogen atom, R represents lower alkyl group with a carbon number of 1-4, and n represents a natural number of not less than 1 and not more than 3.

Figure 1A:
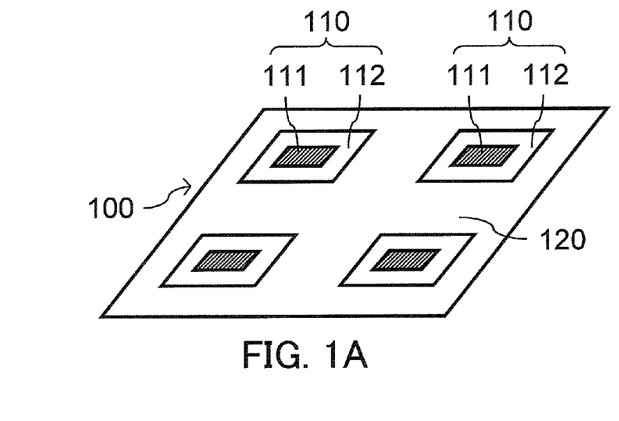
FIGS. 1A to 1D are perspective views showing examples of the hydrophilic region 110 and the water-repellant region 120.
Figure 1B:
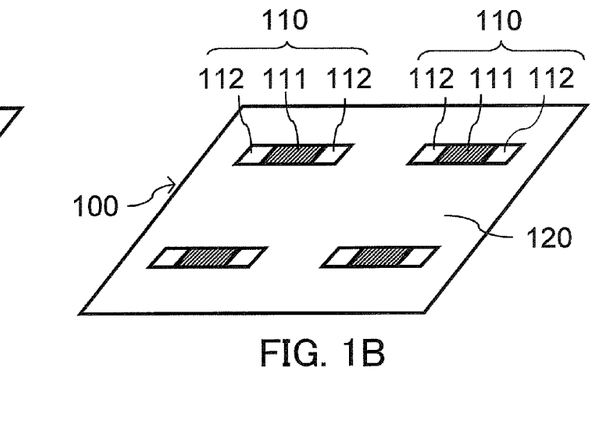
Figure 1C:
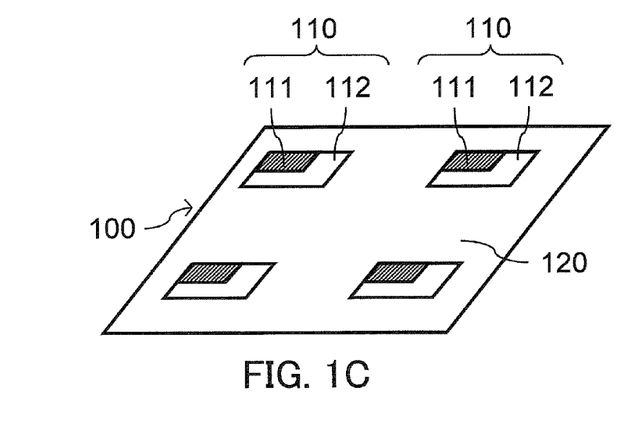
Figure 1D:
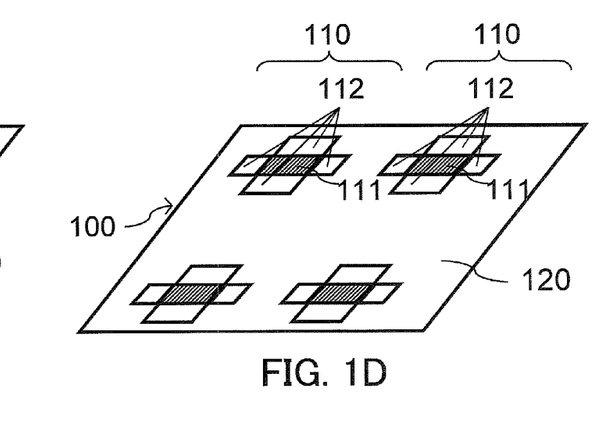
Figure 2A:
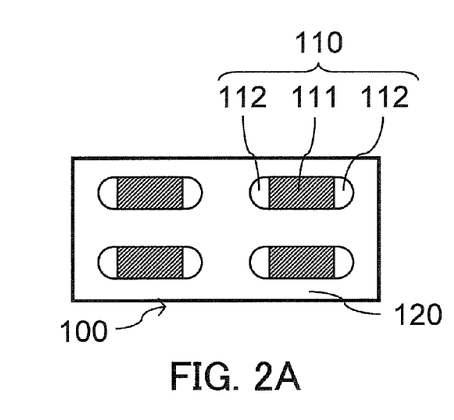
FIGS. 2A to 2E are top views showing examples of the hydrophilic region 110 and the water-repellant region 120.
Figure 2B:
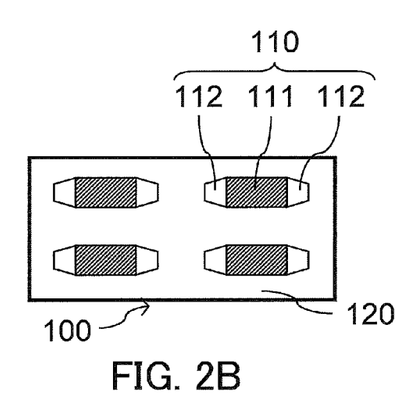
Figure 2C:
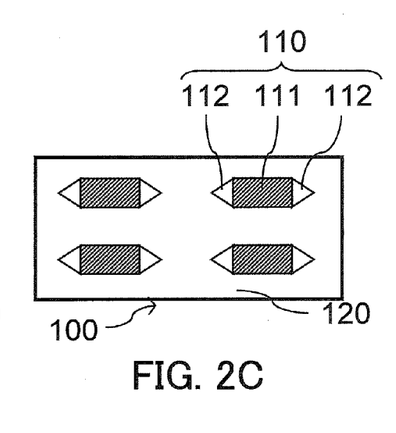
Figure 2D:
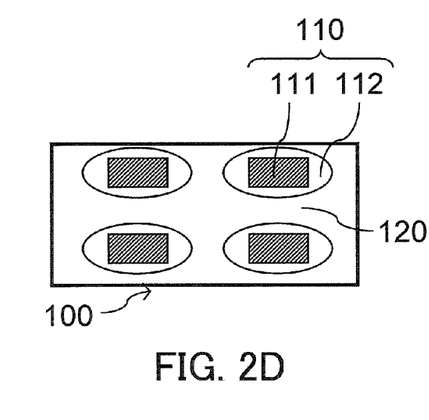
Figure 2E:
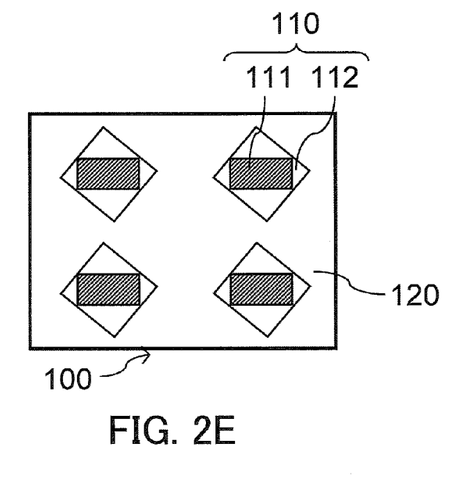
Figure 3:
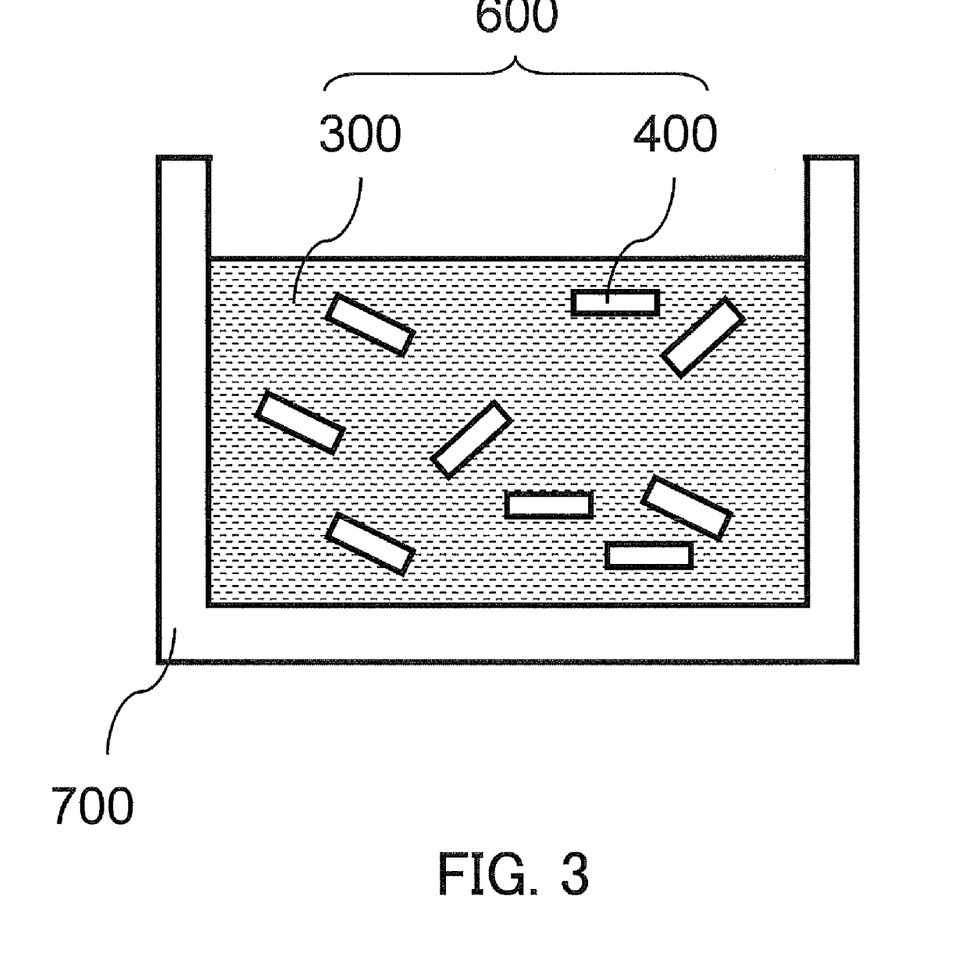
FIG. 3 is a schematic cross-sectional view showing the component-dispersing liquid 600.

In the mounting method of the present invention, a hydrophilic first liquid (Step 1a), a component-dispersing liquid (Step 1b), and a substrate 100 (Step 1c) are prepared. FIG. 3 schematically shows a component-dispersing liquid. FIG. 3 schematically shows the component-dispersing liquid 600 stored in a vessel 700. The component-dispersing liquid 600 contains components 400 dispersed in a second liquid 300. Water is substantially insoluble in the second liquid 300. An example of the second liquid 300 is hydrocarbon such as hexane. Specific other examples of the second liquid 300 are described later. The term "dispersion" in the present specification means a status where the components 400 do not aggregate in the second liquid 300. The component-dispersing liquid 600 may be stirred to disperse the components 400.

Figure 4A:
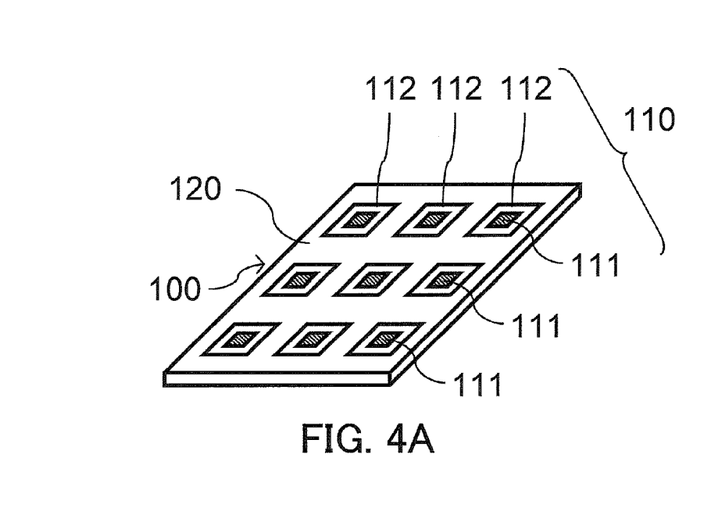
FIGS. 4A to 4D are perspective views showing the steps in the mounting method of the present invention.

FIG. 4A shows the substrate 100 having the surface comprising the component-mounting regions 111, the liquid-capturing regions 112, and the water-repellant region 120, which surrounds these regions 111-112.

Figure 4B:
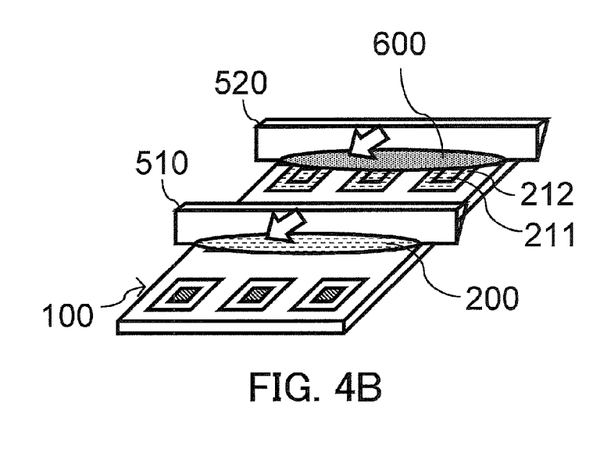

FIG. 4B schematically shows a device of disposing the components and the operation thereof. As shown in the FIG. 4B, the disposing device comprises a first squeegee 510 and a second squeegee 520. The first squeegee 510 is used for subjecting the substrate 100 to water (i.e., the first liquid) 200. The second squeegee 520 is used for subjecting the substrate 100 to the component-dispersing liquid 600. A predetermined distance is maintained between the first squeegee 510 and the second squeegee 520. While the predetermined distance is maintained, the first squeegee 510 and the second squeegee 520 are moved. The means for fixing and moving the squeezes are not shown.

In the mounting method of the present embodiment, first, the movement of the first squeeze 510 brings the substrate 100 in contact with the water. In FIG. 4B, the substrate is not moved and the first squeeze 510 moves. Since the component-mounting region 111 and the liquid-capturing region 112 are surrounded by the water-repellant region 120 having lower wettability to water, the water is disposed on both the component-mounting region 111 and the liquid-capturing region 112 (Step (2)). It is difficult for the water 211 disposed onto the component-mounting region 111 and the water 212 disposed onto the liquid-capturing region 112 to spread out of the component-mounting region 111 and the liquid-capturing region 112, respectively. The arrow in FIG. 4B indicates a movement direction of the first squeegee 510 and the second squeegee 520. In the present embodiment, as shown in FIG. 4B, water 211 and water 212 is disposed onto the component-mounting region 111 and the liquid-capturing region 112, respectively, with the first squeegee 510. Instead of this, the substrate 100 may be immersed in a vessel storing water inside and then drawn up. In this manner, water 211 and water 212 is disposed onto the component-mounting region 111 and the liquid-capturing region 112, respectively.

In order to dispose water onto the component-mounting region 111 and the liquid-capturing region 112 more stably, it is preferable that the wettability of the component-mounting region 111 and the liquid-capturing region 112 to water are much different from the wettability of the water-repellant region 120 to water.

Figure 4C:
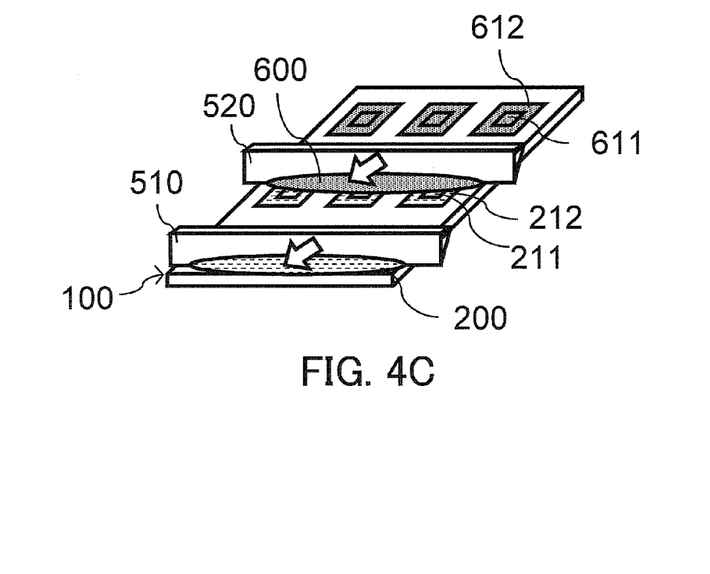

Next, as shown in FIG. 4C, the second squeegee 520 moves from the one side to the other side, namely from the back to the forward in FIG. 4C. This causes the substrate 100 to be subjected to the component-dispersing liquid 600. Since water is substantially insoluble in the second liquid 300, the water 211 and the water 212 present on the component-mounting region 111 and the liquid-capturing region 112 remains stably. During this process, the components 400 move into the water 211 and the water 212 because of the interfacial tension applied to the components 400. Alternatively, the components 400 move to the interface formed by the second liquid 300 and the water 211 or to the interface formed by the second liquid 300 and the water 212.

Figure 4D:
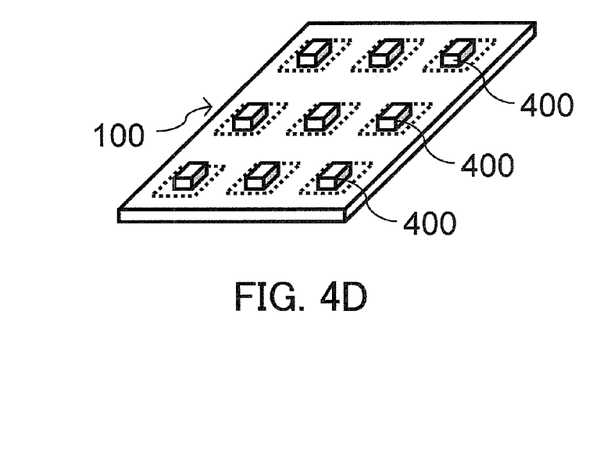

Next, the water 211, the water 212, and the second liquid 300 are removed from the surface of the substrate 100. During this process, as shown in FIG. 4D, the components 400 are disposed onto the component-mounting regions 111.

In the above-mentioned description, the first squeegee 510 and the second squeegee 520 move, while the substrate 100 does not move. Instead of this, neither the first squeegee 510 nor the second squeegee 520 may move, while the substrate 100 may move. Or, the all of the first squeegee 510, the second squeegee 520, and the substrate 100 may move. Hereinafter, these are collectively called "relative movement." Namely, the phrase "the squeegees move on the substrate relatively" includes the following three embodiments: (a) the first squeegee 510 and the second squeegee 520 move, while the substrate 100 does not move, (b) the neither the first squeegee 510 nor the second squeegee 520 moves, while the substrate 100 moves, and (c) all of the first squeegee 510, the second squeegee 520, and the substrate 100 move.

As mentioned above, the component-mounting region 111, the liquid-capturing region 112 comprising the surface represented by the chemical formula (I), and the water-repellant region 120 which surrounds the component-mounting region 111 and the liquid-capturing region 112 are formed on the surface of the substrate 100, the water is disposed accurately onto the component-mounting region 111 and the liquid-capturing region 112. As a result, the components 400 are disposed onto the substrate 100 efficiently and accurately.

The liquid-capturing region 112 and the component-mounting region 111 are described below in more detail.

The disposing method of the present invention is characterized by that the component-mounting region 111 and the liquid-capturing region 112 which are formed in the hydrophilic region 110. As shown in FIGS. 1A to 1D and FIGS. 2A to 2E, the number of the liquid-capturing regions formed in one hydrophilic region 110 may be one or more.

The shape of the liquid-capturing region 112 may be rectangular, triangular, trapezoidal, circular, ellipsoidal, or polygonal. FIGS. 1A to 1D and FIGS. 2A to 2E exemplify the shapes of the liquid-capturing region 112. Two or more of the shapes shown in these drawings can be combined. When one hydrophilic region 110 comprises not less than two liquid-capturing regions 112, each of the liquid-capturing regions 112 may have different shapes. As shown in FIG. 1A, FIG. 1D, FIG. 2D, and FIG. 2E, the liquid-capturing region 112 wholly surrounds the component-mounting region 111. As shown in FIG. 1B, FIG. 1C, FIG. 2A, FIG. 2B, and FIG. 2C, the liquid-capturing region 112 is formed on the periphery of the portion of the component-mounting region 111.

When the area of one component-mounting region 111 is S2, and the sum of the areas of one or more liquid-capturing regions 112 formed on the periphery of the one component-mounting region 111 is S3, it is preferable that the value of S3/S2 is not less than 0.8 and not more than 3.5.

In the present embodiment, the liquid-capturing region 112 is formed with use of the material represented by $X-(CH_2)_n-Si-Y_3$ (Chemical Formula (II)). The material represented by Chemical Formula (II) is described below.

In Formula (II), X represents $N^+R_3Q^-$ (Q represents Cl, Br, or I), OR, or halogen atom. R represents lower alkyl group. R may be linear or branched. "Lower alkyl group" means an alkyl group having a carbon number of 1-4. An example of these is methyl group, ethyl group, n-propyl group, iso-propyl group, n-butyl group, or iso-butyl group. The numeral "n" represents a natural number of not less than 1 and not more than 3. Y is preferably alkoxy group or halogen. A preferred alkoxy group is methoxy or ethoxy.

In the present embodiment, the material represented by Chemical formula (II) reacts with the surface of the substrate 100 to form the liquid-capturing region 112. An example of the material represented by Chemical formula (II) is 3-chloro-propyl-trichlorosilane, 3-methoxy-propyl-trimethoxysilane, or N-trimethoxy-silylpropyl-N,N,N-trimethylammonium chloride.

In light of introduction easiness of the surface of the substrate 100 and in light of availability, the material represented by Chemical formula (II) is preferably trialkoxysilane or trichlorosilane.

Next, the component-mounting region 111 is described.

The shape of the component-mounting region 111 is determined according to the shape of the component 400 to be mounted on the component-mounting region 111. The shape of component-mounting region 111 includes, for example, a polygonal shape such as a triangle, a quadrangle, or a hexagon, or a circular or an elliptical shape. The component-mounting region 111 preferably has the identical shape to that of a predetermined surface of the component 400 to be mounted (the surface that faces the substrate when mounted on the substrate). The phrase "having the identical/same shape" means that the shape of the predetermined surface of the component 400 to be mounted (that faces the substrate when mounted on the substrate) and the shape of the component-mounting region 111 are in a congruent or similar relationship in a mathematical sense.

When the area of the predetermined surface of the component 400 to be mounted is S1, and when the area of one of the component-mounting region 111 is S2, the value of S2/S1 is preferably not less than 0.64 and not more than 1.44. When the value of S2/S1 is smaller than 0.64, the hydrophilic region 110 has a significantly small amount of water, which reduces the probability of disposing the component 400 therein. When the value of S2/S1 is greater than 1.44, the hydrophilic region 110 has significantly excess water. This causes a plurality of components 400 to be mounted in one component-mounting region 111.

The component-mounting region 111, the liquid-capturing region 112, and the water-repellant region 120 can be formed by photolithography.

An example of one method of preparing the substrate 100 is described in more detail with reference to drawings.

Figure 5A:
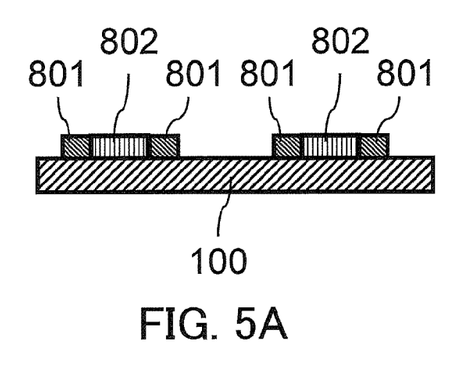
FIGS. 5A to 5E are cross-sectional views showing the steps in the method for preparing the substrate used for the mounting method of the present invention.

FIGS. 5A to 5E show an example of a method for preparing the substrate. First, as shown in FIG. 5A, a hydrophilic substrate 100 is prepared. A protective film such as a metal film 802 is formed to cover the portion which is to be the component-mounting region 111. A protective film such as a positive resist film 801 is formed to cover the portion which is to be the liquid-capturing region 112.

Figure 5B:
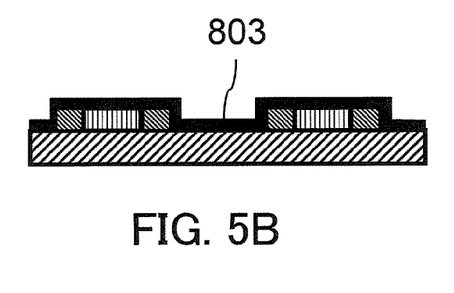
Figure 5C:
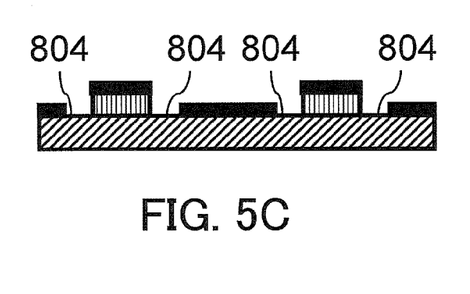

Next, as shown in FIG. 5B, a water-repellant film 803 is formed to cover the substrate 100. Subsequently, as shown in FIG. 5C, the positive resist film 801 is removed with acetone or dimethylsulfoxide. In this process, a region 804 where the substrate surface is exposed is formed.

Figure 5D:
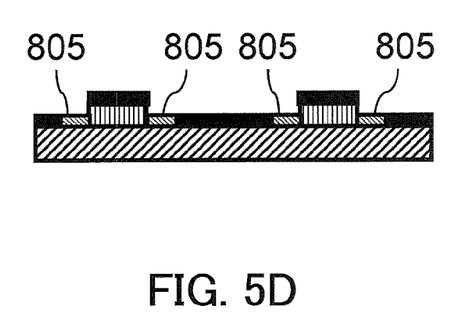

Next, as shown in FIG. 5D, the material represented by Chemical Formula (II) is supplied to the region 804. During this process, the region 805 comprising the material represented by Chemical Formula (II) is formed in the region 804. The region 805 corresponds to the liquid-capturing region 112.

A method for forming the liquid-capturing region 112 is described below. The substrate 100 is immersed into chloroform, alkane, alcohol, or silicone oil where the material represented by Chemical Formula (II) is dissolved at a concentration of 2-3% to form the liquid-capturing region 112. After the immersion, the substrate 100 is washed with the solvent to form the film represented by Chemical Formula (I) on the substrate. The substrate 100, which reacts with the material represented by Chemical Formula (II), preferably has active hydrogen on the surface thereof. An example of the material of the substrate 100 is silicon oxide, silicon nitride, stainless steel, copper, nickel or surface-activated resin.

Figure 5E:
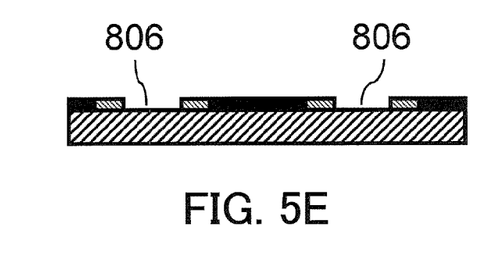
Figure 6A:
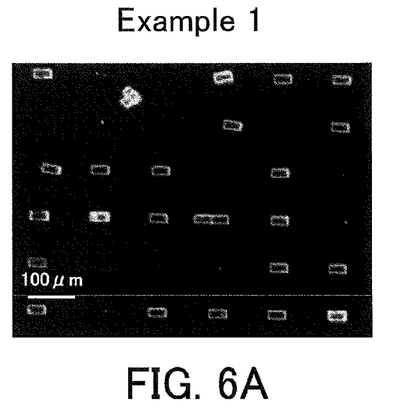
FIGS. 6A to 6D are microscope photographs of the silicon oxide plates disposed on the substrate in the examples 1-4, respectively.
Figure 6B:
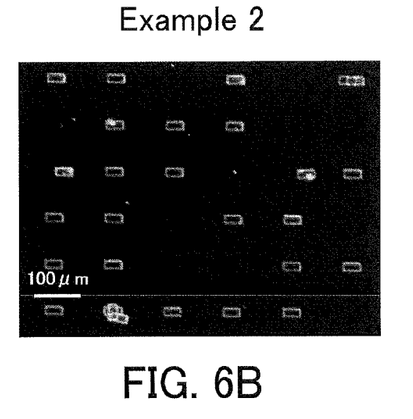
Figure 6C:
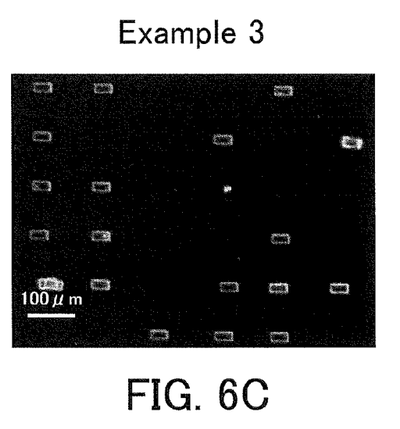
Figure 6D:
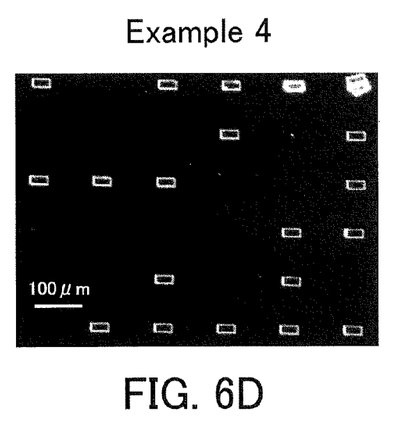

Finally, as shown in FIG. 5E, the metal film 802 is removed to form the region exposing the surface of the substrate 100. Thus, the component-mounting region 111, the liquid-capturing region 112, and the water-repellant region 120 are formed.

Next, the water-repellant region 120 is described.

The wettability of a solid surface with respect to water is related not only to the surface energy of the solid but also the surface tension of the water. The value of the surface energy of the water-repellent region 120 is not particularly limited. However, it is preferable that the value is not less than 5 mJ/m$^2$ and less than 40 mJ/m$^2$. More preferably, the value is not less than 5 mJ/m$^2$ and not more than 25 mJ/m$^2$.

The surface of the water-repellant region 120 is covered with a fluorine compound. An example of the method for forming the water-repellant region 120 comprises a step of forming an organic film containing fluorine on the substrate 100. The organic film has lower wettability to water than both of the component-mounting region 111 and the liquid-capturing region 112. An example of the organic film is a polymer film having fluoroalkyl chains, a film formed of a silane coupling agent or thiol molecules having fluoroalkyl chains, or an organic-inorganic hybrid film having fluoroalkyl chains formed by a sol-gel method.

An example of the polymer film having fluoroalkyl chains is polytetrafluoroethylene, polydifluoroethylene, or derivatives thereof.

When the water-repellent film is formed with a silane coupling agent, the substrate may be immersed in chloroform, alkane, alcohol, or silicone oil where the silane coupling agent is dissolved at a concentration of 2-3 vol %. After the immersion, the substrate is washed with the solvent to form a monomolecular film. The silane coupling agent having fluoroalkyl group is represented by a general formula $CF_3(CF_2)_n(CH_2)_mSiX_3$. Here, n is a natural number of not more than 10, m is a natural number of not more than 10, X is halogen (preferably Cl) or alkoxy group. Examples of the silane coupling agents are $CF_3(CF_2)_7C_2H_4SiCl_3$ and $CF_3C_2H_4SiCl_3$.

When the water-repellant film is formed with a thiol molecular having fluoro alkyl chain, a metal film such as a gold film, a silver film, or copper film is formed only on the part required to be water-repellant. The substrate is immersed in an organic solution dissolving the thiol compound to cause only the part where the metal film is formed to be water-repellant. Particularly, the substrate comprising the metal film is immersed in an ethanol solution or a propanol solution where the thiol molecular having a fluoroalkyl chain is dissolved at a concentration of 2-3%. Next, the substrate is washed with alcohol, and the water-repellant monomolecular film is formed. In this method, the substrate is not required to have active hydrogen.

When the water-repellant film is formed by a sol-gel method, an alcohol solution in which tetraethoxysilane, which is a precursor of silicon oxide, alkoxysilane having a fluoroalkyl chain, acid catalyst, and water are dissolved is applied to the substrate by spin coating or dipping. Subsequently, the substrate is heated at or above 100 degrees Celsius. This water-repellent film can be formed on almost all kinds of substrates.

A water-repellent film may be directly formed by methods such as ink jet printing, screen printing, relief printing, intaglio printing, and microcontact printing.

In the step (4), the water 211, the water 212, and the second liquid 300 are removed from the substrate 100. The components 400 are disposed in predetermined positions, irrespective of the order of removing of the water 211, the water 212, and the second liquid 300.

The method of removing the water 211, the water 212, and the second liquid 300 is not limited. A known drying method is used. Natural drying, drying in a vacuum desiccator, drying by blowing air or gas, or drying by heating and/or under reduced pressure can be selected. The substrate 100 may be washed before drying.

In the above-mentioned description, the example of the first liquid 200 is water. However, the first liquid 200 and the second liquid 300 may be selected appropriately in consideration of the interfacial tension that acts on the interface between the first liquid 200 and the second liquid 300 and the respective degrees of wettability of the first liquid 200 and the second liquid 300 with respect to the surface of the component 400.

The first liquid 200 is required to be substantially insoluble in the second liquid 300. Because the first liquid 200 is substantially insoluble in the second liquid 300, the first liquid 200 stays stably in the component-mounting region 111 when the second liquid 300 comes in contact with the first liquid 200. And the resulting interfacial tension allows the component 400 to move into the first liquid 200. The phrase "substantially insoluble" means that the solubility defined by the weight of the first liquid dissolved in 100 ml of the second liquid is 10 gram or less, and more preferably 1 gram or less.

For example, the first liquid 200 has great polarity, and the second liquid 300 has smaller polarity than the first liquid 200. Namely, the first liquid 200 is hydrophilic. On the contrary, the second liquid 300 is hydrophobic.

An example of the first liquid 200 is water. Instead of water, alcohol such as methanol, ethanol, ethylene glycol, or glycerol, or a mixture of such alcohol and water can be used. Water is more suitable because it has a high surface tension and therefore enables the component 400 to be held firmly in the component-mounting region 111.

An example of the second liquid 300 is alkanes such as hexane, heptane, octane, nonane, decane, undecane, dodecane, tridecane, tetradecane, pentadecane, and hexadecane; aromatic hydrocarbons such as toluene, benzene, and xylene; chlorinated solvents such as chloromethane, dichloromethane, chloroform, carbon tetrachloride, monochlorobutane, dichlorobutane, monochloropentane, and dichloropentane; ethers such as diethyl ether, and petroleum ether; esters such as ethyl acetate, and butyl acetate; silicone oil; perfluorooctane; perfluorononane; or mixtures of these. It is preferable that the second liquid 300 is a chlorinated solvent.

The material of the substrate 100 is not limited. A substrate formed of an inorganic material, a polymeric resin material, or a composite of an inorganic material and a polymeric resin material may be used. The inorganic material includes ceramics such as alumina, silicon, and glass. The polymeric resin material includes polyimide resin, polyamide resin, epoxy resin, and polycarbonate resin. The composite of an inorganic material and a polymeric resin material is, for example, a composite material containing fibers made of glass, ceramic or metal, and a polymeric resin material. An SOI (Silicon On Insulator) substrate or a compound semiconductor substrate may also be used.

The method for preparing the component 400 and the component-dispersing liquid 600 is not limited. Particularly, see the method for preparing the component and the component-dispersing liquid disclosed in U.S. Pat. No. 7,730,610.

When a high-polarity liquid such as water is used as the first liquid 200, it is preferable that the component 400 has a higher surface energy. Particularly, the surface energy is 40 mJ/m$^2$ or more. When the surface energy of the component 400 is low, it is preferable to treat the surface of the component 400 to increase its surface energy beforehand (before the step (2) in the mounting method of the present invention).

Examples of the method to increase the surface energy of the component 400 are described below:

(1) When the component 400 has silicon on its surface, the surface may be irradiated with ultraviolet light in an ozone atmosphere. This method is efficient for an electrode material such as platinum, gold, copper, or nickel.

(2) A thin film (for example, a hydrophilic film when the water is used as the first liquid 200) having an affinity for the first liquid 200 may be formed on the surface of the component 400. For example, a hydrophilic film of silicon oxide, silicon nitride, or titanium oxide may be formed on the surface of the component 400 by a vacuum sputtering method or a thermal CVD method. After the formation of the hydrophilic film, it is preferred that the surface of the component 400 is irradiated with ultraviolet light in an ozone atmosphere.

(3) The surface of the component 400 can be modified with a silane coupling agent having an amino group, a carboxyl group, or a hydroxyl group at the terminal position.

(4) The surface can be modified with a thiol molecular having an amino group, a carboxyl group, or a hydroxyl group at the terminal position.

The component-mounting region 111, the liquid-capturing region 112 represented by the chemical formula (I), and the water-repellant region 120, which surrounds the component-mounting region 111 and the liquid-capturing region 112, are formed on the surface of the substrate 100. This causes water to be disposed on the component-mounting region 111 and the liquid-capturing region 112 accurately. As a result, the component 400 can be mounted on the substrate with high efficiency and high accuracy.

EXAMPLES

The following examples describe the disposing method of the present invention in more detail.

Example 1

<Preparation of the Substrate onto which the Components are Mounted>

First, similar to the method described in the embodiment, a plurality of hydrophilic regions 110 surrounded by the water-repellant region 120 were formed on a silicon substrate. In the example 1, two rectangular regions were formed on the substrate 110 in order to measure static contact angles with regard to pure water in the component-mounting region 111 and the liquid-capturing region 112. The shape of each of the two regions was a square with 1 cm×1 cm.

The surface of a 4 inch silicon substrate with a thickness of 525 micrometers was oxidized by plasma treatment in an atmosphere containing oxygen to provide a hydrophilic property to the entire surface. Then, a nickel film with a thickness of 10 nm was formed by an electron-beam evaporation technique. Furthermore, a gold film with a thickness of 100 nm was formed on the nickel film. Subsequently, a rectangular positive resist pattern with 20 micrometers×40 micrometers was formed by photolithography. This resist pattern corresponded to the component-mounting regions 111. Next, the substrate 100 was immersed in the gold etchant and in the nickel etchant in this order to remove the metal films at the portion which the resist did not cover. Subsequently, the substrate 100 was subjected to the oxygen plasma atmosphere in vacuum to remove the resist so as to form a plurality of the metal patterns.

Next, a rectangular positive resist pattern with 40 micrometers×60 micrometers was formed on the periphery of each of the plurality of the metal patterns (see FIG. 1A) by photolithography. This pattern corresponded to the liquid-capturing regions 112.

In a dry atmosphere, the substrate 100 was immersed for twenty minutes in a perfluorooctane solution containing $CF_3$ $(CF_2)_7C_2H_4SiCl_3$ at a concentration of 1 vol % (hereinafter, "FS-17") so as to form a water-repellent film. Subsequently, the substrate 100 was washed in pure perfluorooctane, and then the solvent was removed. Furthermore, the resist film was removed with acetone. Thus, the region 804 on which the substrate surface was exposed was formed (See, FIG. 5C).

Next, the substrate 100 was immersed for one hundred and eighty minutes in a dry atmosphere in a dehydrated methanol solution where N-trimethoxy-silylpropyl-N,N,N-trimethylammounium chloride was dissolved at a concentration of 1 vol %. Subsequently, the substrate was washed with pure methanol and the solvent was removed. Thus, the region 805, which corresponded to the liquid-capturing region 112 was formed on the substrate 100 (See, FIG. 5D).

Furthermore, the substrate 100 was immersed in the gold etchant and the nickel etchant in this order to remove the metal films. Thus, the region 806, which corresponded to the component-mounting region 111 (See, FIG. 5E) was formed on the substrate.

Thus, the plurality of the hydrophilic regions 110 surrounded by the water-repellant region 120 were formed on the substrate 100.

The rectangular region (1 cm×1 cm) equivalent to the component-mounting region 111 had a static contact angle of 15 degree with regard to pure water. The rectangular region (1 cm×1 cm) equivalent to the liquid-capturing region 112 had a static contact angle of 33 degree with regard to pure water. The water-repellant region 120 had a static contact angle of 108 degree with regard to pure water.

<Components-Containing Liquid>

The component-dispersing liquid 600 containing the components 400 comprising silicon oxide plates was prepared in accordance with the following process.

First, an aluminum film with a thickness of 100 nm was formed on a silicon substrate with a thickness of 525 micrometers by electron beam evaporation. Subsequently, a silicon oxide film with a thickness of 200 nm was formed by plasma CVD. Rectangular resist patterns of 20 micrometers×40 micrometers were formed on the resulting substrate by photolithography. A part of the silicon oxide was removed by dry etching using the resist patterns as masks. Then, the remaining resist films were removed by oxygen plasma-ashing treatment to form a plurality of silicon oxide plates. Each of the silicon oxide plates was 20 micrometers long×40 micrometers wide×0.2 micrometers high. Subsequently, the aluminum thin film was etched in a 50 degrees Celsius mixture of phosphoric acid and nitric acid (hereinafter referred to as hot phosphoric acid) to lift-off the silicon oxide plates.

Next, the silicon oxide plates dispersed in the hot phosphoric acid were subjected to suction filtration through a filter. The filter to which the silicon oxide plates adhered was dried overnight in a dry atmosphere. Then, the filter was immersed for two hours in a 1,4-dichlorobutane solution containing 1-chloroethyl-trichlorosilane at a concentration of 1 vol. %. Suction filtration was carried out in a dry nitrogen atmosphere, and unreacted 1-chloroethyl-trichlorosilane was removed by washing. Thus, silicon oxide plates with chemically-modified surfaces were obtained on the filter. This filter was immersed in 1,4-dichlorobutane and an ultrasonic wave was applied to disperse the silicon oxide plates that had adhered to the filter in the 1,4-dichlorobutane. Thus, the component-dispersing liquid was obtained.

<Squeezes>

The bottom of the squeeze 510 had a slit for disposing water. The slit was 20 millimeters long and 0.5 millimeters wide. In order to hold water stably, the slit had absorbent cotton inside.

The squeeze 520 was a knife made of polyethylene.

<Disposing Method>

The first squeegee 510 and the second squeegee 520 were disposed along one end of the substrate 100 in such a manner that the edge surfaces of these squeegees were orthogonal to the longitudinal direction of the substrate 100. The distances between the edge surfaces of these squeegees and the substrate 100 were set to be approximately 0.2 micrometers. The distance between the first squeegee 510 and the second squeegee 520 was set to be 1 mm.

Next, approximately fifty microliters of the silicon oxide plates dispersion liquid were disposed between the second squeegee 520 and the substrate 100 with a glass pipette. Subsequently, the first squeegee 510 and the second squeegee 520 were moved at a rate of 10 mm/second. This process was repeated ten times.

Example 2

A similar experiment to that of example 1 was performed except that a 1,4-dichlorobutane solution of 3-methoxy-propyl-trimethoxysilane was used instead of the dehydrated methanol solution of N-trimethoxy-silylpropyl-N,N,N-trimethylammounium chloride. The rectangular region equivalent to the component-mounting region 111 had a static contact angle of 13 degree with regard to pure water. The rectangular region equivalent to the liquid-capturing region 112 had a static contact angle of 52 degree with regard to pure water.

Example 3

A similar experiment to that of example 1 was performed except that a 1,4-dichlorobutane solution of 3-chloro-propyl-trichlorosilane was used instead of the dehydrated methanol solution of N-trimethoxy-silylpropyl-N,N,N-trimethylammounium chloride. The rectangular region equivalent to the component-mounting region 111 had a static contact angle of 13 degree with regard to pure water. The rectangular region equivalent to the liquid-capturing region 112 had a static contact angle of 72 degree with regard to pure water.

Example 4

A similar experiment to that of example 2 was performed except that the water-repellant region 120 was formed with $CF_3C_2H_4SiCl_3$ (hereinafter, "FS-3"). The rectangular region equivalent to the component-mounting region 111 had a static contact angle of 14 degree with regard to pure water. The rectangular region equivalent to the liquid-capturing region 112 had a static contact angle of 52 degree with regard to pure water. The water-repellant region 120 had a static contact angle of 103 degree with regard to pure water.

Comparative Example 1

A similar experiment to that of example 1 was performed except that the resist pattern for forming the liquid-capturing region 112 was not formed and that the treatment of N-trimethoxy-silylpropyl-N,N,N-trimethylammounium chloride was not performed. Namely, the liquid-capturing region 112 was not formed, and only the component mount region 111 and the water-repellant region 120 were formed. The rectangular region equivalent to the component-mounting region 111 had a static contact angle of 15 degree with regard to pure water.

Comparative Example 2

A similar experiment to that of example 1 was performed except that the treatment of N-trimethoxy-silylpropyl-N,N, N-trimethylammounium chloride was not performed. Namely, in the comparative example 2, the liquid-capturing region 112 was not formed. The size of one component-mounting region 111 in the comparative example 2 was substantially equal to the sum of the size of one component-mounting region 111 in the example 1 and the size of the liquid-capturing regions 112 in the periphery thereof. The rectangular region equivalent to the component-mounting region 111 had a static contact angle of 13 degree with regard to pure water.

Table 1 shows surface treatment reagents for the regions and static contact angles with regard to pure water in the examples 1-4 and the comparative examples 1-2.

TABLE 1

| | Hydrophilic region | | | | | |
| --- | --- | --- | --- | --- | --- | --- |
| | Liquid-capturing region | | Component-mount region Surface | | Water-repellant region Surface | |
| | Surface Treatment Reagent | Contact Angle | Treatment Reagent | Contact Angle | Treatment Reagent | Contact Angle |
| Example 1 | N-trimethylsilylpropyl-N,N,N-trimethylammonium chloride | 33 | (Not treated) | 15 | FS-17 | 108 |

TABLE 1-continued

| | Hydrophilic region | | | | |
|---|---|---|---|---|---|
| | Liquid-capturing region | | Component-mount region | | Water-repellant region |
| | | | Surface | | Surface |
| | Surface Treatment Reagent | Contact Angle | Treatment Reagent | Contact Angle | Treatment Reagent | Contact Angle |
| Example 2 | 3-methoxypropyl-trimethoxysilane | 52 | (Not treated) | 13 | FS-17 | 108 |
| Example 3 | 3-chloropropyl-trichlorosilane | 72 | (Not treated) | 13 | FS-17 | 108 |
| Example 4 | 3-methoxypropyl-trimethoxysilane | 52 | (Not treated) | 14 | FS-3 | 103 |
| Comparative Example 1 | (Not formed) | — | (Not treated) | 15 | FS-17 | 108 |
| Comparative Example 2 | (Not treated) | 13 | (Not treated) | 13 | FS-17 | 108 |

FIGS. 6A to 6D were photographs of the substrate 100 where the silicon oxide plates were disposed in the examples 1-4, respectively. The white rectangular is a silicon oxide plate mounted on the hydrophilic region. The black part is the water-repellant region 120. FIGS. 6A to 6D show that the silicon oxide plates were mounted on the substrate 110 in such a manner that the silicon oxide plates had an identical mounting direction.

Figure 7A:
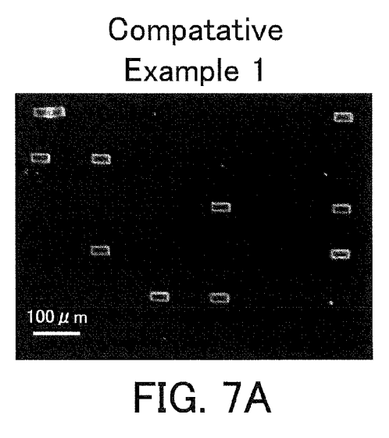
FIGS. 7A and 7B are microscope photographs of the silicon oxide plates disposed on the substrate in the comparative examples 1-2, respectively.
Figure 7B:
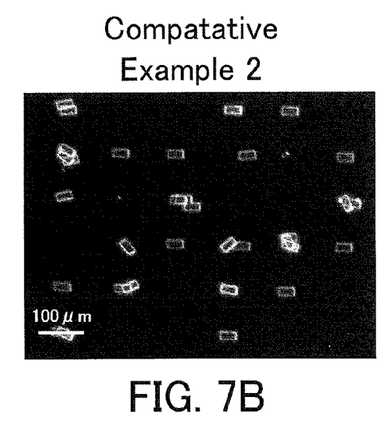

FIG. 7A and FIG. 7B were photographs of the substrate 100 where the silicon oxide plates were mounted in the comparative examples 1-2, respectively.

A status of disposition of the silicon oxide plates onto the substrate 100 was observed by a microscope to evaluate the examples and the comparative examples. Particularly, thirty-six hydrophilic regions were arbitrarily selected. Out of the selected thirty-six hydrophilic regions, the number (Np) of the hydrophilic regions where one silicon oxide plate was disposed accurately was counted. Furthermore, the number ($N_1$) of the hydrophilic regions where a plurality of plates were mounted was counted. The number (N2) of the hydrophilic regions where one silicon oxide plate was mounted in the distorted state was also counted. Nc denotes the sum of N1 and N2.

Table 2 shows the values of Np and Nc/Np in the examples 1-4 and the comparative examples 1-2.

TABLE 2

| | the number of the hydrophilic regions | Np | Nc | Nc/Np |
|---|---|---|---|---|
| Example 1 | 36 | 22 | 3 | 0.14 |
| Example 2 | 36 | 23 | 2 | 0.09 |
| Example 3 | 36 | 18 | 1 | 0.06 |
| Example 4 | 36 | 18 | 2 | 0.11 |
| Comparative Example 1 | 36 | 9 | 1 | 0.11 |
| Comparative Example 2 | 36 | 13 | 11 | 0.84 |

As shown in Table 2, the values of Np in the examples 1-4 were 18-23. In the examples 1-4, the values of Nc/Np were less than 0.2, which was good.

On the contrary, the values of Np in the comparative example 1 and the comparative example 2 were 9 and 13, respectively. These values were less than those of the examples 1-4. Furthermore, the value of Nc/Np was 0.84, which was very bad.

From the above-mentioned results, it is understood that the method according to the examples achieves a great improvement of the efficiency of disposing the components without loss of the accuracy of disposing the components. Accordingly, the method according to the examples is much excellent than the method according to the comparative examples.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

INDUSTRIAL APPLICABILITY

The present method of disposing the components is utilized for disposing the components including electric elements and pillar-shaped microcomponents. The present method of disposing the components is utilized for fabricating an electric device and an electric component. For example, the method of the present invention is used for fabricating a circuit board and an electric device including the same, and for repairing the circuit board and the electric device including the same.

What is claimed is:

1. A method for mounting a component on a substrate, the method comprising steps of:
   a step of preparing a hydrophilic first liquid;
   a step of preparing a component-dispersing liquid where the component is dispersed in a second liquid, the second liquid being insoluble in the first liquid, and at least one surface of the component being hydrophilic;
   a step of preparing the substrate comprising a hydrophilic region and a water-repellant region, wherein:
      the water-repellant region surrounds the hydrophilic region,
      the water-repellant region comprises a surface coated with a fluorine compound,
      the hydrophilic region comprises a component-mounting region having a shape congruent or similar to that of a bottom surface of the component and a liquid-capturing region formed on a periphery of the component-mounting region, the surface of the liquid capturing region is formed by the reaction of a material represented by the chemical formula: $X-(CH_2)_n-Si-Y_3$ with the surface of the substrate, where X represents $N^+R_3Q^-$ (Q represents Cl, Br, or I), OR, or halogen atom, R represents lower alkyl group with a carbon number of 1-4, n represents a natural number of not less than 1 and not more than 3, Y is an alkoxy group or a halogen, a contact angle of the liquid-capturing region is greater than that of the component-mounting region, and the contact angle of the liquid-capturing region is less than that of the water-repellant region;

a step of disposing the first liquid to the hydrophilic region;

a step of bringing the component-dispersing liquid in contact with the first liquid disposed on the hydrophilic region; and a step of removing the first liquid and the second liquid from the substrate to dispose the component on the hydrophilic region.

2. The method according to claim 1, wherein the liquid-capturing region is formed on a part of the periphery of the component-mounting region.

3. The method according to claim 1, wherein the liquid-capturing region is formed on all the periphery of the component-mounting region.

4. The method according to claim 1, wherein the second liquid is hydrophobic.

5. The method according to claim 4, the first liquid is water and the second liquid is a chlorinated solvent.

6. The method according to claim 1, wherein the second liquid had a less polarity than the first liquid.

7. The method according to claim 1, further comprising a step of making the surface of the component to be hydrophilic before the step of disposing the first liquid.

* * * * *